United States Patent
Gardner et al.

(10) Patent No.: US 11,798,988 B2
(45) Date of Patent: Oct. 24, 2023

(54) GRADED PLANAR BUFFER FOR NANOWIRES

(71) Applicant: Microsoft Technology Licensing, LLC, Redmond, WA (US)

(72) Inventors: Geoffrey C. Gardner, West Lafayette, IN (US); Sergei V. Gronin, West Lafayette, IN (US); Raymond L. Kallaher, West Lafayette, IN (US); Michael James Manfra, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/736,930

(22) Filed: Jan. 8, 2020

(65) Prior Publication Data

US 2021/0210599 A1    Jul. 8, 2021

(51) Int. Cl.
*H01L 29/06* (2006.01)
*H01L 21/02* (2006.01)
*H01L 21/3205* (2006.01)
*H01L 29/20* (2006.01)

(52) U.S. Cl.
CPC .... *H01L 29/0673* (2013.01); *H01L 21/02392* (2013.01); *H01L 21/02395* (2013.01); *H01L 21/02398* (2013.01); *H01L 21/02463* (2013.01); *H01L 21/02466* (2013.01); *H01L 21/02546* (2013.01); *H01L 21/02549* (2013.01);
(Continued)

(58) Field of Classification Search
None
See application file for complete search history.

(56) References Cited

U.S. PATENT DOCUMENTS

| 6,576,518 B1 | 6/2003 | Yamada et al. |
| 7,829,416 B2 | 11/2010 | Kudou et al. |
| 9,472,468 B2 | 10/2016 | Van Dal et al. |

(Continued)

FOREIGN PATENT DOCUMENTS

| WO | 2018125081 A1 | 7/2018 |
| WO | 2019074557 A1 | 4/2019 |

OTHER PUBLICATIONS

"International Search Report and Written Opinion Issued in PCT Application No. PCT/US2021/020464", dated Jun. 16, 2021, 11 Pages.
(Continued)

*Primary Examiner* — Daniel Whalen
(74) *Attorney, Agent, or Firm* — Withrow & Terranova, PLLC

(57) ABSTRACT

A nanowire structure includes a substrate, a graded planar buffer layer, a patterned mask, and a nanowire. The graded planar buffer layer is on the substrate. The patterned mask is on the graded planar buffer layer and includes an opening through which the graded planar buffer layer is exposed. The nanowire is on the graded planar buffer layer in the opening of the patterned mask. A lattice constant of the graded planar buffer layer is between a lattice constant of the substrate and a lattice constant of the nanowire. By providing the graded planar buffer layer, lattice mismatch between the nanowire and the substrate can be reduced or eliminated, thereby improving the quality and performance of the nanowire structure.

26 Claims, 3 Drawing Sheets

(52) U.S. Cl.
CPC .. *H01L 21/02639* (2013.01); *H01L 21/32058* (2013.01); *H01L 29/20* (2013.01)

(56) References Cited

U.S. PATENT DOCUMENTS

| | | | |
|---|---|---|---|
| 10,629,798 | B1 | 4/2020 | Kallaher et al. |
| 10,777,728 | B2 | 9/2020 | Aseev et al. |
| 10,978,632 | B2 | 4/2021 | Kallaher et al. |
| 2005/0142804 | A1 | 6/2005 | Shin |
| 2008/0258132 | A1 | 10/2008 | Liu et al. |
| 2011/0117740 | A1 | 5/2011 | Martinez et al. |
| 2013/0099283 | A1 | 4/2013 | Lin et al. |
| 2015/0207028 | A1 | 7/2015 | Romano et al. |
| 2015/0228730 | A1* | 8/2015 | Yang ............... H01L 27/092 257/369 |
| 2016/0126322 | A1 | 5/2016 | Ye et al. |
| 2017/0054021 | A1* | 2/2017 | Kunert .............. H01L 29/7846 |
| 2018/0358436 | A1 | 12/2018 | Jambunathan et al. |
| 2021/0375623 | A1 | 12/2021 | Gardner et al. |
| 2021/0375624 | A1 | 12/2021 | Gardner et al. |

OTHER PUBLICATIONS

"International Search Report and Written Opinion Issued in PCT Application No. PCT/US2021/020474", dated Jun. 11, 2021, 24 Pages.

Muessig, B.H. et al., "Selective high-temperature-stable oxygen implantation and MBE-overgrowth technique," Gallium Arsenide and Related Compounds 1993, Proceedings of the 20th International Symposium on Gallium Arsenide and Related Compounds, Frieburg, Germany, Aug. 29-Sep. 2, 1993, Institute of Physics Conference Series No. 136, Institute of Physics Publishing, pp. 529-534.

Pearton, S.J., "Ion Implantation for Isolation of III-V Semiconductors," Materials Science Reports, vol. 4, 1990, pp. 313-363.

Jiao, et al., "Studying of Linearly Graded Buffer Layer Effect on Quality of InGaAs on GaAs Substrate", In 6th International Symposium on Advanced Optical Manufacturing and Testing Technologies: Optoelectronic Materials and Devices for Sensing, Imaging, and Solar Energy, vol. 8419, Oct. 15, 2012, 7 Pages.

"International Search Report and Written Opinion Issued in PCT Application No. PCT/US20/065023", dated Mar. 23, 2021, 32 Pages.

Zhang, et al., "The Effect of Buffer Types on the In0. 82Ga0. 18As Epitaxial Layer Grown on an InP (100) Substrate", In Journal of Materials, vol. 11, Issue 6, Jun. 8, 2018, pp. 1-11.

Non-Final Office Action for U.S. Appl. No. 16/887,635, dated May 28, 2021, 9 pages.

Krishnan, M., et al., "Chemical Mechanical Planarization: Slurry Chemistry, Materials, and Mechanisms," Chemical Reviews, vol. 110, No. 1, 2010, American Chemical Society, pp. 178-204.

Vaitiekenas, S., et al., "Selective Area Grown Semiconductor-Superconductor Hybrids: A Basis for Topological Networks," Physical Review Letters, vol. 121, No. 14, 2018, 8 pages.

Zhou, Y., et al., "Characterization of sapphire chemical mechanical polishing performances using silica with different sizes and their removal mechanisms," Colloids and Surfaces A: Physicochemical and Engineering Aspects, vol. 513, Jan. 2017, Elsevier B.V., pp. 153-159.

"Final Office Action Issued in U.S. Appl. No. 16/887,635", dated Feb. 4, 2022, 8 Pages.

"Non Final Office Action Issued in U.S. Appl. No. 16/887,480", dated Feb. 9, 2022, 14 Pages.

"Final Office Action Issued in U.S. Appl. No. 16/887,635", dated Dec. 9, 2021, 8 Pages.

"Notice of Allowance Issued in U.S. Appl. No. 16/887,635", dated May 20, 2022, 8 Pages.

"Final Office Action Issued in U.S. Appl. No. 16/887,480", dated Jul. 26, 2022, 11 Pages.

"Corrected Notice of Allowability Issued in U.S. Appl. No. 16/887,635," dated Jun. 1, 2022, 4 pages.

"Non Final Office Action Issued in U.S. Appl. No. 16/887,480", dated Jan. 27, 2023, 11 Pages.

"Final Office Action Issued in U.S. Appl. No. 16/887,480", dated Jul. 11, 2023, 12 Pages.

* cited by examiner

GRADED PLANAR BUFFER FOR NANOWIRES

FIELD OF THE DISCLOSURE

The present disclosure relates to nanowires grown by Selective Area Growth (SAG) or Selective Area Epitaxy (SAE), and in particular to planar buffers for reducing defects during growth of nanowires in nanowire networks and methods for manufacturing the same.

BACKGROUND

Nanowires show great promise for applications in quantum computing. Unfortunately, it is difficult to manufacture high quality nanowires. Conventional processes for manufacturing nanowires include selective-area-growth (SAG) wherein nanowires are selectively grown directly on a substrate through a patterned mask. To function properly, nanowires must be a conducting semiconductor material such as indium arsenide, indium antimonide, or indium arsenide antimonide. The substrate on which the nanowires are grown often must be an insulating material such as gallium arsenide, gallium antimonide, indium phosphide, gallium phosphide, silicon, or germanium. There is often a large difference in the crystal lattice constant of the substrate and the nanowires to be grown via SAG. This crystal lattice mismatch causes crystalline defects in the nanowires during growth such as dislocations and stacking faults. The crystalline defects can penetrate the nanowires and in turn decrease the performance of the resulting nanowires.

In light of the above, there is a need for nanowires with reduced crystalline defects and methods of manufacturing the same.

SUMMARY

In one embodiment, a nanowire structure includes a substrate, a graded planar buffer layer, a patterned mask, and a nanowire. The graded planar buffer layer is on the substrate. The patterned mask is on the graded planar buffer layer and includes an opening through which the graded planar buffer layer is exposed. The nanowire is on the graded planar buffer layer in the opening of the patterned mask. A lattice constant provided at the surface on which the nanowire is provided by the graded planar buffer layer is between a lattice constant of the substrate and a lattice constant of the nanowire. By providing the graded planar buffer layer, lattice mismatch between the nanowire and the substrate can be reduced or eliminated, thereby improving the quality and performance of the nanowire structure.

In one embodiment, the lattice constant of the graded planar buffer layer at least partially transitions between the lattice constant of the substrate and the lattice constant of the nanowire between a first surface of the graded planar buffer layer on the substrate and a second surface of the graded planar buffer layer opposite the first surface on which the nanowire is provided. In another embodiment, the lattice constant of the graded planar buffer layer completely transitions between the lattice constant of the substrate and the lattice constant of the nanowire between the first surface and the second surface. The graded planar buffer layer may be provided as a blanket layer over an entire surface of the substrate.

In one embodiment, a method for manufacturing a nanowire structure includes providing a substrate, providing a graded planar buffer layer on the substrate, providing a patterned mask on the graded planar buffer layer, and providing a nanowire on the graded planar buffer layer in an opening of the patterned mask. The graded planar buffer layer is provided such that a lattice constant of the graded planar buffer layer is between a lattice constant of the substrate and a lattice constant of the nanowire. By providing the graded planar buffer layer, lattice mismatch between the nanowire and the substrate can be reduced or eliminated, thereby improving the quality and performance of the nanowire structure.

In one embodiment, the graded planar buffer layer is provided such that the lattice constant of the graded planar buffer layer at least partially transitions between the lattice constant of the substrate and the lattice constant of the nanowire between a first surface of the graded planar buffer layer on the substrate and a last surface of the graded planar buffer layer on which the nanowire is provided. In another embodiment, the graded planar buffer layer is provided such that the lattice constant of the graded planar buffer layer completely transitions between the lattice constant of the substrate and the lattice constant of the nanowire between the first surface and the last surface. The graded planar buffer layer may be provided as a blanket layer over an entire surface of the substrate.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
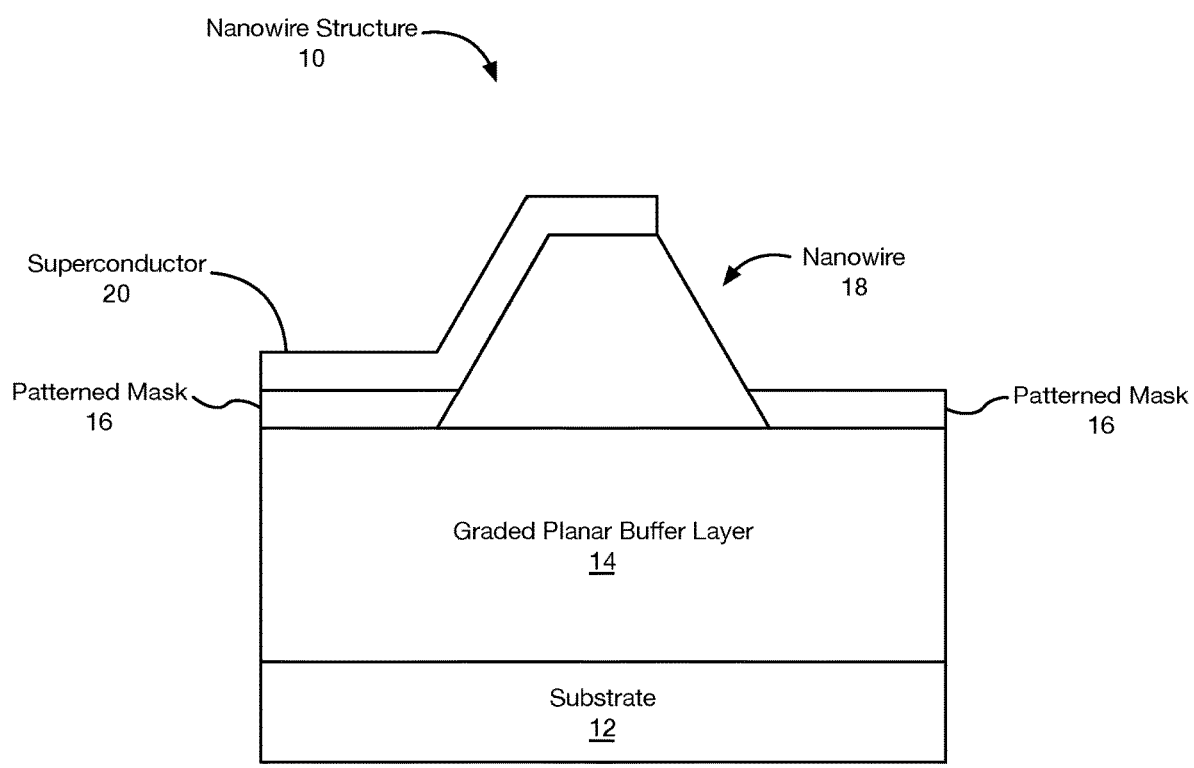
FIG. 1 illustrates a nanowire structure according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a nanowire structure 10 according to one embodiment of the present disclosure. The nanowire structure 10 includes a substrate 12, a graded planar buffer layer 14 on the substrate 12, a patterned mask 16 on the buffer layer 14, the patterned mask 16 including an opening through which a surface of the graded planar buffer layer 14 is exposed, a nanowire 18 on the graded planar buffer layer 14 in the opening of the patterned mask 16, and a superconductor 20 on the nanowire 18 and a portion of the patterned mask 16. As discussed above, conventionally the nanowire 18 would be provided directly on the substrate 12. For the nanowire 18 to be functional, it must comprise a conductive semiconductor such as indium arsenide, indium antimonide, and indium arsenide antimonide. Further, the substrate 12 must be an insulator such as gallium arsenide, gallium antimonide, and indium phosphide. Conducting semiconductors and insulators generally have very different lattice constants, resulting in a high lattice mismatch between the nanowire 18 and the substrate 12 in conventional nanowire structures 10.

To solve this problem, the graded planar buffer layer 14 is provided between the substrate 12 and the nanowire 18. The graded planar buffer layer 14 has a lattice constant that is between the lattice constant of the substrate 12 and the lattice constant of the nanowire 18. In some embodiments, the graded planar buffer layer 14 provides a transition between the lattice constant of the substrate 12 and the lattice constant of the nanowire 18 over a thickness of the graded planar buffer layer 14 such that the transition occurs from a first surface of the graded planar buffer layer 14 on the substrate 12 to a second surface of the graded planar buffer layer 14 on which the nanowire 18 is provided. The graded planar buffer layer 14 may provide a partial transition between the lattice constant of the substrate 12 and the lattice constant of the nanowire 18 or a complete transition between the lattice constant of the substrate 12 and the lattice constant of the nanowire 18. The graded planar buffer layer 14 may comprise multiple discrete layers, each of which has different physical properties. For example, the graded planar buffer layer 14 may comprise multiple layers, each of which has a different lattice constant in order to provide the transition in lattice constant from the lattice constant of the substrate 12 to the lattice constant of the nanowire 18 as discussed above. In various embodiments, the graded planar buffer layer 14 may comprise one or more layers of indium aluminum arsenide, indium aluminum antimonide, indium gallium arsenide, indium gallium phosphide, indium aluminum arsenide antimonide, indium gallium aluminum antimonide, aluminum gallium arsenide antimonide, and indium gallium arsenide antimonide. Providing the graded planar buffer layer 14 provides a much better lattice match for the nanowire 18 than the substrate 12. Accordingly, defects such as misfit dislocations, slip planes, and stacking faults can be reduced or eliminated. Further, other desirable properties, such as electrical confinement and insulation, can be maintained by selecting the appropriate material for the graded planar buffer layer 14.

The substrate 12 may comprise one of silicon, indium phosphide, gallium phosphide, gallium antimonide, and gallium arsenide. The substrate 12 may have a thickness between 50 µm and 1000 µm. The graded planar buffer layer 14 may have a thickness between 100 nm and 50000 nm. The patterned mask 16 may comprise a dielectric material such as silicon dioxide. The nanowire 18 may have a thickness between 20 nm and 300 nm. The nanowire 18 may further have a diameter of the order of a nanometer ($10^{-9}$ meters) and up to 1000 nm, or a ratio of length to width greater than 1000. The superconductor may comprise one of aluminum, lead, niobium indium, tin, and vanadium. The superconductor 20 may have a thickness between 3 nm and 30 nm. The present disclosure contemplates any and all permutations and combinations of the above materials and thicknesses for the substrate 12, the graded planar buffer layer 14, the patterned mask 16, and the nanowire 18.

Figure 2:
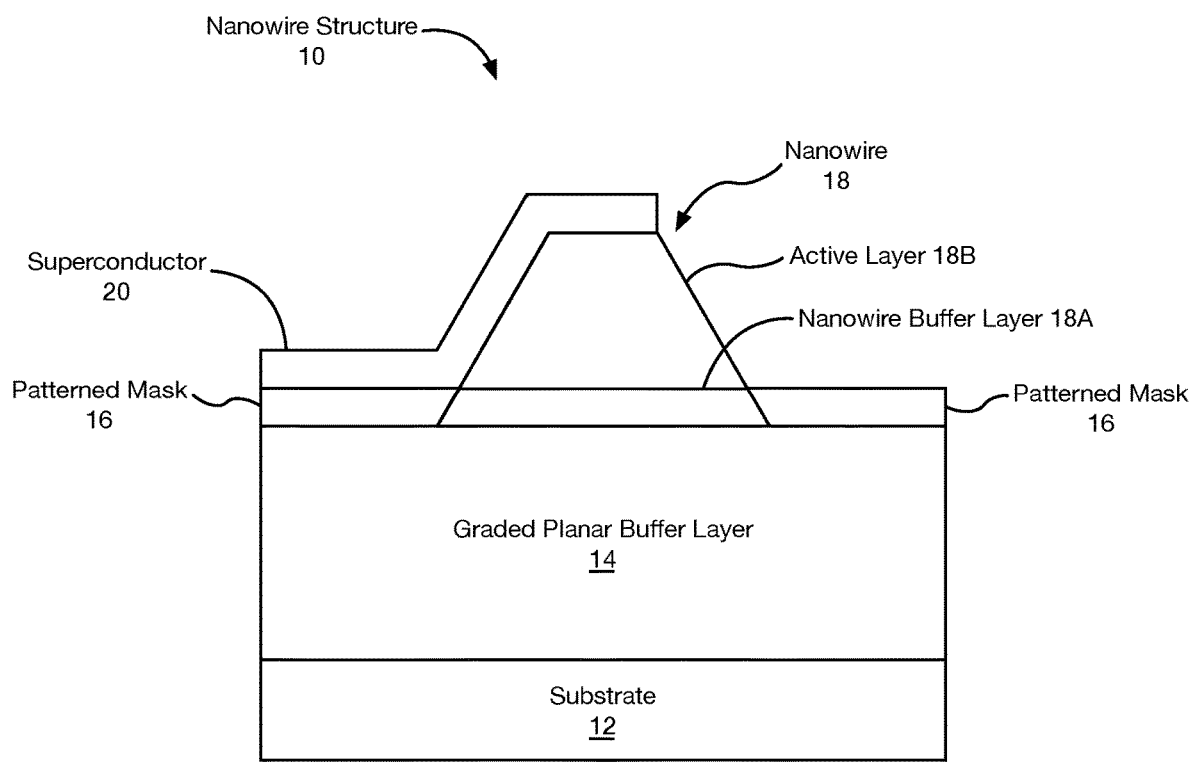
FIG. 2 illustrates a nanowire structure according to one embodiment of the present disclosure.

FIG. 2 shows the nanowire structure 10 according to an additional embodiment of the present disclosure. The nanowire structure 10 shown in FIG. 2 is substantially similar to that shown in FIG. 1, except that the nanowire 18 includes a nanowire buffer layer 18A and an active layer 18B. The nanowire buffer layer 18A may be provided to provide additional lattice matching between the graded planar buffer layer 14 and the active layer 18B. Accordingly, the nanowire buffer layer 18A may have a lattice constant that is between a lattice constant of the graded planar buffer layer 14 and the active layer 18B. Further, the nanowire buffer layer 18A may provide a transition in lattice constant from a lattice constant of the graded planar buffer layer 14 and the lattice constant of the active layer 18B. Nanowire buffer layers 18A have been used in the past to provide lattice matching, but are limited in their ability to do so because of constraints on the thickness thereof, as providing the nanowire buffer layer 18A above a certain thickness limits the available area for the active layer 18B of the nanowire 18, which provides the functionality thereof. The graded planar buffer layer 14 is not limited in its thickness, and thus can provide a much larger transition in lattice constant while maintaining other desirable characteristics of the substrate 12 such as electrical insulation. In contrast to the nanowire buffer layer 18A, which is provided only in the opening of the patterned mask 16 and forms part of the nanowire 18, the graded planar buffer layer 14 is provided as a blanket layer over an entire surface of the substrate 12 such that the patterned mask 16 is provided on the graded planar buffer layer 16.

In one exemplary embodiment, the substrate 12 is indium phosphide, and has a thickness of 350 µm. The graded planar buffer layer 14 includes several layers, including a first layer of $In_{0.52}Al_{0.48}As$ having a thickness of 100 nm on the substrate 12, a second layer of $In_{0.53}Ga_{0.47}As$ having a thickness of 2.5 nm on the first layer, a third layer of $In_{0.52}Al_{0.48}As$ having a thickness of 2.5 nm on the second layer, a fourth layer on the third layer, the fourth layer transitioning from $In_{0.52}Al_{0.48}As$ to $In_{0.89}Al_{0.11}As$ over a thickness of 1000 nm, for example, as 20 discrete layers having a thickness of 50 nm, a fifth layer of $InAl_{0.20}As$ having a thickness of 33 nm on the fourth layer, a sixth layer of $InAl_{0.20}As$ having a thickness of 25 nm on the fifth layer, and a seventh layer of $InGa_{0.20}As$ having a thickness of 4 nm on the sixth layer. The nanowire 18 may include a first layer of $InGa_{0.30}As$ on the graded planar buffer layer 14 having a thickness of 60 nm, a second layer of InAs having a thickness of 10 nm on the first layer, and a third layer of $InGa_{0.30}As$ having a thickness of 60 nm on the second layer. The various layers of the graded planar buffer layer 14 provide a transition in lattice constant between the substrate 12 and the nanowire 18. Notably, the particular configuration of the graded planar buffer layer 14 and the nanowire 18, including the number of layers, the thickness of the layers, and the material composition of each layer shown in FIG. 3 are merely exemplary and are not intended to limit the scope of the present disclosure in any way.

In another exemplary embodiment, the substrate 12 is gallium antimonide and has a thickness of 350 µm. The graded planar buffer layer 14 includes a first layer of gallium antimonide having a thickness of 500 nm, a second layer of $Al_{0.8}Ga_{0.2}AsSb$ having a thickness of 50 nm on the first layer, and a third layer of indium arsenide having a thickness of 2 monolayers (ML) on the second layer. The nanowire 18 may comprise a single layer of indium arsenide having a thickness of 150 nm. Those skilled in the art will appreciate that gallium antimonide has a lattice constant that is relatively close to that of indium arsenide. However, other properties (e.g., electrical confinement and isolation) of gallium antimonide may not be ideal as a platform for the nanowire 18. The graded planar buffer layer 14 may thus primarily be provided in this embodiment to provide one or more other desirable properties (e.g., electrical confinement and isolation), rather than for lattice matching.

Figure 3:
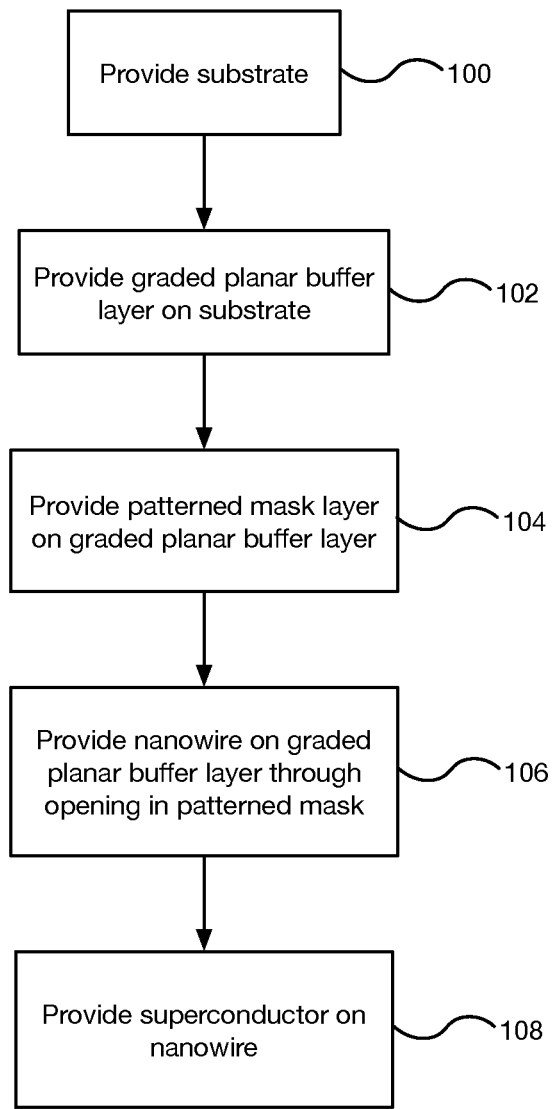
FIG. 3 is a flow chart illustrating a method for manufacturing a nanowire structure according to one embodiment of the present disclosure.

FIG. 3 is a flow diagram illustrating a method for manufacturing the nanowire structure 10 according to one embodiment of the present disclosure. The method begins by providing the substrate 12 (block 100). The graded planar buffer layer 14 is provided on the substrate 12 (block 102). The graded planar buffer layer 14 may be provided by any suitable manufacturing process. As discussed above, the graded planar buffer layer 14 may comprise multiple layers, each having different properties, and thus providing the graded planar buffer layer 14 may comprise providing several layers one on top of the other. Further as discussed above, the graded planar buffer layer 14 is provided as a blanket layer over an entire surface of the substrate. The patterned mask 16 is provided on the graded planar buffer layer 14 (block 104). Providing the patterned mask 16 on the graded planar buffer layer 14 may comprise providing a blanket mask layer on an entire surface of the graded planar buffer layer 14 then patterning the blanket mask layer by any suitable process to provide the patterned mask 16. The nanowire 18 is provided on the graded planar buffer layer 14 through one or more openings in the patterned mask 16 (block 106). Providing the nanowire 18 may comprise performing a selective-area-growth (SAG) process, or any other suitable manufacturing process. As discussed above, the nanowire 18 may include multiple layers such as the nanowire buffer layer 18A and the active layer 18B and thus providing the nanowire 18 may comprise providing more than one layer. The superconductor 20 is provided on the nanowire 18 (block 108) and, optionally, on a portion of the patterned mask 16.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
    a substrate;
    a graded planar buffer layer, which comprises a plurality of discrete layers, on the substrate;
    a patterned mask residing on a top surface of the graded planar buffer layer, the patterned mask comprising an opening through which the graded planar buffer layer is exposed; and
    a nanowire on the graded planar buffer layer in the opening of the patterned mask,
    wherein:
        a lattice constant of the graded planar buffer layer is between a lattice constant of the substrate and a lattice constant of the nanowire;
        the substrate comprises indium phosphide;
        within the graded planar buffer layer, certain ones of the plurality of discrete layers comprise indium aluminum arsenide with transitions in both indium concentration and aluminum concentration, and at least another one of the plurality of discrete layers comprises indium gallium arsenide; and
        the nanowire comprises indium gallium arsenide and indium arsenide.

2. The apparatus of claim 1 wherein the lattice constant of the graded planar buffer layer partially or completely transitions between the lattice constant of the substrate and the lattice constant of the nanowire between a first surface of the graded planar buffer layer on the substrate and a second surface of the graded planar buffer layer on which the nanowire is provided.

3. The apparatus of claim 1 wherein each of the plurality of discrete layers has different properties.

4. The apparatus of claim 1 wherein the graded planar buffer layer provides electrical insulation.

5. The apparatus of claim 1 wherein a thickness of the graded planar buffer layer is between 100 nm and 50000 nm.

6. The apparatus of claim 1 wherein:
the nanowire comprises a nanowire buffer layer and an active layer on the nanowire buffer layer; and
a lattice constant of the nanowire buffer layer is between the lattice constant of the graded planar buffer layer and a lattice constant of the active layer.

7. A method for manufacturing a nanowire structure comprising:
providing a substrate;
providing a graded planar buffer layer, which comprises a plurality of discrete layers, on the substrate;
providing a patterned mask on a top surface of the graded planar buffer layer, the patterned mask comprising an opening through which the graded planar buffer layer is exposed; and
providing a nanowire on the graded planar buffer layer after the patterned mask is provided, wherein:
the nanowire is laterally confined in the opening of the patterned mask and protrudes vertically beyond a top surface of the patterned mask;
the graded planar buffer layer is provided such that a lattice constant of the graded planar buffer layer is between a lattice constant of the substrate and a lattice constant of the nanowire;
the substrate comprises indium phosphide;
within the graded planar buffer layer, at least one of the plurality of discrete layers comprises indium aluminum arsenide, and at least another one of the plurality of discrete layers comprises indium gallium arsenide; and
the nanowire comprises indium gallium arsenide and indium arsenide.

8. The method of claim 7 wherein the graded planar buffer layer is provided such that the lattice constant of the graded planar buffer layer partially or completely transitions between the lattice constant of the substrate and the lattice constant of the nanowire between a first surface of the graded planar buffer layer on the substrate and a second surface of the graded planar buffer layer on which the nanowire is provided.

9. The method of claim 7 wherein each of the plurality of discrete layers has different physical properties.

10. The method of claim 7 wherein the graded planar buffer layer provides electrical insulation.

11. The method of claim 7 wherein the graded planar buffer layer is provided such that a thickness of the graded planar buffer layer is between 100 nm and 50000 nm.

12. The method of claim 7 wherein providing the nanowire comprises providing a nanowire buffer layer and providing an active layer on the nanowire buffer layer such that a lattice constant of the nanowire buffer layer is between the lattice constant of the graded planar buffer layer and a lattice constant of the active layer.

13. The method of claim 7 further comprising providing a superconductor layer on the nanowire.

14. An apparatus comprising:
a substrate;
a graded planar buffer layer, which comprises a plurality of discrete layers, on the substrate;
a patterned mask residing on a top surface of the graded planar buffer layer, the patterned mask comprising an opening through which the graded planar buffer layer is exposed; and
a nanowire on the graded planar buffer layer in the opening of the patterned mask,
wherein:
a lattice constant of the graded planar buffer layer is between a lattice constant of the substrate and a lattice constant of the nanowire;
within the graded planar buffer layer, a first layer of the plurality of discrete layers comprises gallium antimonide, a second layer of the plurality of discrete layers comprises aluminum gallium arsenide antimonide, and a third layer of the plurality of discrete layers comprises indium arsenide;
the substrate comprises gallium antimonide; and
the nanowire comprises indium arsenide.

15. The apparatus of claim 14 wherein the lattice constant of the graded planar buffer layer partially or completely transitions between the lattice constant of the substrate and the lattice constant of the nanowire between a first surface of the graded planar buffer layer on the substrate and a second surface of the graded planar buffer layer on which the nanowire is provided.

16. The apparatus of claim 14 wherein each of the plurality of discrete layers has different properties.

17. The apparatus of claim 14 wherein the graded planar buffer layer provides electrical insulation.

18. The apparatus of claim 14 wherein a thickness of the graded planar buffer layer is between 100 nm and 50000 nm.

19. The apparatus of claim 14 wherein:
the nanowire comprises a nanowire buffer layer and an active layer on the nanowire buffer layer; and
a lattice constant of the nanowire buffer layer is between the lattice constant of the graded planar buffer layer and a lattice constant of the active layer.

20. A method for manufacturing a nanowire structure comprising:
providing a substrate;
providing a graded planar buffer layer, which comprises a plurality of discrete layers, on the substrate;
providing a patterned mask on a top surface of the graded planar buffer layer, the patterned mask comprising an opening through which the graded planar buffer layer is exposed; and
providing a nanowire on the graded planar buffer layer after the patterned mask is provided, wherein:
the nanowire is laterally confined in the opening of the patterned mask and protrudes vertically beyond a top surface of the patterned mask;
the graded planar buffer layer is provided such that a lattice constant of the graded planar buffer layer is between a lattice constant of the substrate and a lattice constant of the nanowire;
the substrate comprises gallium antimonide;
within the graded planar buffer layer, at least one of the plurality of discrete layers comprises aluminum gallium arsenide antimonide, and at least another one of the plurality of discrete layers comprises indium arsenide; and
the nanowire comprises indium arsenide.

21. The method of claim 20 wherein the graded planar buffer layer is provided such that the lattice constant of the graded planar buffer layer partially or completely transitions between the lattice constant of the substrate and the lattice constant of the nanowire between a first surface of the graded planar buffer layer on the substrate and a second surface of the graded planar buffer layer on which the nanowire is provided.

22. The method of claim 20 wherein each of the plurality of discrete layers has different physical properties.

23. The method of claim 20 wherein the graded planar buffer layer provides electrical insulation.

24. The method of claim 20 wherein the graded planar buffer layer is provided such that a thickness of the graded planar buffer layer is between 100 nm and 50000 nm.

25. The method of claim 20 wherein providing the nanowire comprises providing a nanowire buffer layer and providing an active layer on the nanowire buffer layer such that a lattice constant of the nanowire buffer layer is between the lattice constant of the graded planar buffer layer and a lattice constant of the active layer.

26. The method of claim 20 further comprising providing a superconductor layer on the nanowire.

\* \* \* \* \*